United States Patent
Russ et al.

(10) Patent No.: US 6,587,320 B1
(45) Date of Patent: Jul. 1, 2003

(54) APPARATUS FOR CURRENT BALLASTING ESD SENSITIVE DEVICES

(75) Inventors: Christian Cornelius Russ, Princeton, NJ (US); Koen Gerard Maria Verhaege, Princeton, NJ (US)

(73) Assignee: Sarnoff Corporation, Princeton, NJ (US)

(*) Notice: Subject to any disclaimer, the term of this patent is extended or adjusted under 35 U.S.C. 154(b) by 213 days.

(21) Appl. No.: 09/583,141

(22) Filed: May 30, 2000

Related U.S. Application Data (60) Provisional application No. 60/174,326, filed on Jan. 4, 2000.

(51) Int. Cl.$^7$ ................................................. H02H 9/00
(52) U.S. Cl. ........................................ 361/56; 257/361
(58) Field of Search ........................ 361/56, 91.1, 91.5; 257/361, 357, 355, 360

(56) References Cited

U.S. PATENT DOCUMENTS

| | | | |
|---|---|---|---|
| 4,306,246 A | | 12/1981 | Davies et al. |
| 4,811,155 A | | 3/1989 | Kuriyama et al. |
| 4,930,036 A | | 5/1990 | Sitch |
| 5,218,222 A | | 6/1993 | Roberts |
| 5,248,892 A | * | 9/1993 | Van Roozendaal et al. . 257/357 |
| 5,404,041 A | * | 4/1995 | Diaz et al. ................... 257/360 |
| 5,477,414 A | * | 12/1995 | Li et al. ........................ 361/56 |
| 5,498,892 A | | 3/1996 | Walker et al. |
| 5,547,881 A | | 8/1996 | Wang et al. |
| 5,602,409 A | | 2/1997 | Olney |
| 5,620,920 A | | 4/1997 | Wilmsmeyer |
| 5,637,902 A | | 6/1997 | Jiang |
| 5,640,299 A | * | 6/1997 | Leach ........................... 361/56 |
| 5,654,860 A | | 8/1997 | Casper et al. |
| 5,663,589 A | * | 9/1997 | Saitoh et al. ................ 257/401 |
| 5,721,439 A | | 2/1998 | Lin |

(List continued on next page.)

FOREIGN PATENT DOCUMENTS

| | | |
|---|---|---|
| DE | 196 51 247 | 10/1997 |
| EP | 0 011 879 | 6/1980 |
| EP | 0355501 A2 | 8/1989 |
| EP | 0 387 944 | 9/1990 |
| EP | 0441126 A2 | 1/1991 |
| EP | 0656659 A2 | 12/1994 |
| EP | 0730332 A1 | 9/1996 |
| GB | 1 380 427 | 1/1975 |
| JP | 8-8441 | 1/1996 |

OTHER PUBLICATIONS

PCT International Search Report, Apr. 12, 2001.

*Primary Examiner*—Brian Sircus
*Assistant Examiner*—Zeev Kitov
(74) *Attorney, Agent, or Firm*—William J. Burke (57) ABSTRACT

A current ballasting circuit for an ESD protection device couples nonintersecting conductive strips between a common contact pad and the contact electrodes of the ESD protection device. The connecting strips form respective electrically isolated ballasting resistors between the external contact pad and the contact electrodes of the ESD device. In addition, lateral resistances are formed between the contact strips which enhance the operation of the multiple ballasting resistors. The conductive strips may be made from metal, polysilicon or by a vertically meandering series connection of polysilicon layers, metal layers and interconnecting vias. The lateral resistance between the parallel conductive paths may be enhanced by segmenting both the drain and source electrodes. In one example, the gate electrode of an MOS ESD device extends locally between each pair of strips to segment the drain and source regions. The lateral resistance between the conductive strips is further enhanced by defining an additional gate electrode, having a portion that is parallel to the gate electrode of the ESD device and further portions that extend between the conductive strips. Multiple ESD devices may be connected in parallel to provide additional paths for shunting ESD current.

18 Claims, 6 Drawing Sheets

U.S. PATENT DOCUMENTS

| | | | |
|---|---|---|---|
| 5,742,083 A | * 4/1998 | Lin | ................... 257/355 |
| 5,744,839 A | 4/1998 | Ma et al. | |
| 5,763,919 A | 6/1998 | Lin | |
| 5,767,552 A | 6/1998 | Casper et al. | |
| 5,793,083 A | 8/1998 | Amerasekera et al. | |
| 5,796,570 A | 8/1998 | Mekdhanasarn et al. | |
| 5,811,845 A | 9/1998 | Isono et al. | |
| 5,834,356 A | 11/1998 | Bothra et al. | |
| 5,844,281 A | 12/1998 | Narita | |
| 5,854,504 A | 12/1998 | Consiglio | |
| 5,946,573 A | 8/1999 | Hsu | |
| 5,977,595 A | 11/1999 | Ham | |
| 5,990,520 A | 11/1999 | Noorlag et al. | |
| 5,991,134 A | 11/1999 | Tan et al. | |
| 6,004,838 A | 12/1999 | Ma et al. | |
| 6,022,769 A | 2/2000 | Wu | |
| 6,028,758 A | 2/2000 | Sharpe-Geisler | |
| 6,222,710 B1 | * 4/2001 | Yamaguchi | ................... 361/56 |

* cited by examiner

APPARATUS FOR CURRENT BALLASTING ESD SENSITIVE DEVICES

This patent application claims the benefit of U.S. Provisional Application No. 60/174,326 filed Jan. 4, 2000, the contents of which are incorporated by reference herein.

FIELD OF THE INVENTION

This invention relates generally to current protection of electronic devices and specifically to current ballasting in fully silicided electrostatic discharge sensitive devices.

BACKGROUND OF THE INVENTION

Integrated circuits including metal-oxide-semiconductor (MOS) transistors receive input signals and transfer output signals in the form of a voltage. These devices are typically made with very small device dimensions in order to maximize the amount of circuitry that can be implemented on the integrated circuit and to allow the circuitry to operate at high frequencies yet with minimal power demands. A problem with these devices, however, is their sensitivity to damage from electrical overstresses applied to the input terminals, output terminals or to internal circuit nodes of the integrated circuit. The gate oxides for these devices are typically very thin and can break down if an applied voltage exceeds even relatively low levels. Such breakdown may cause immediate or expedited destruction of transistors or other devices. Excess voltage is often caused by stress in the form of electrostatic discharge (ESD). As is well known, ESD events, although brief, may exhibit relatively large currents, on the order of amperes. In order to combat problems associated with ESD events, manufacturers of MOS devices design protection devices that provide paths through which to discharge nodes rapidly. Protection devices may be positioned between the input buffer or output buffer pads of a device and a source of reference potential (e.g., ground) to quickly conduct the ESD voltage away from the devices that may be harmed. Note that the terms ESD device, ESD protection device, and ESD sensitive device are used interchangeably throughout this document.

Figure 1:
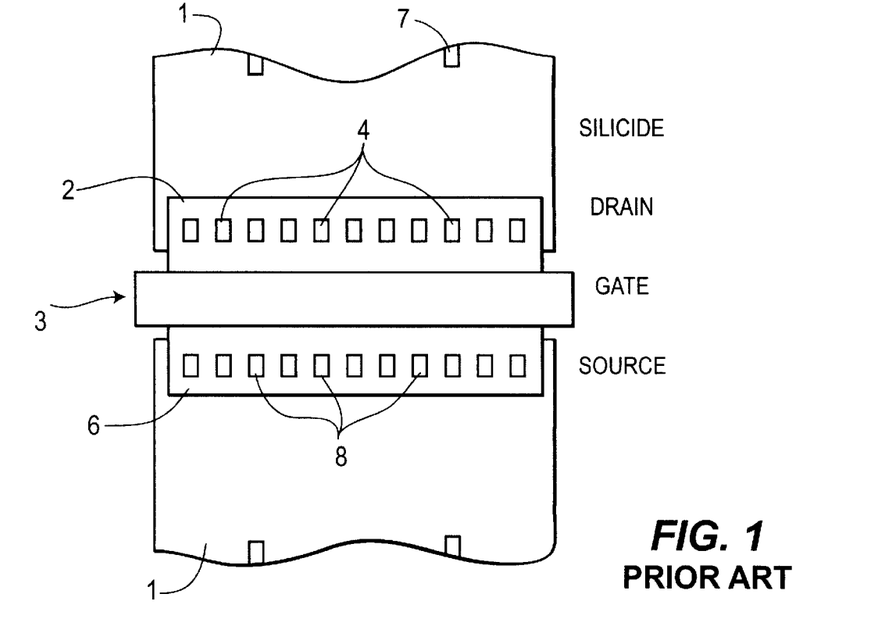
FIG. 1 (prior art) is a plan view of a fully silicided NMOS device.

FIG. 1 is a top-plan view of one such ESD protection device. The exemplary device is implemented as an N-channel MOS transistor having source and drain regions and a gate electrode over a channel region that separates the source and drain regions. Although the device is implemented as an MOS transistor, it operates, in ESD protection mode as a parasitic bipolar transistor having a collector region corresponding to the drain region, an emitter region corresponding to the source region and a base region corresponding to the channel region. In a typical configuration, the gate electrode is tied to a source of reference potential (e.g. ground) either by a direct connection or through a resistive connection. As is well known, when the potential between the collector and the emitter ($V_{ce}$) of the bipolar transistor becomes greater than a predetermined voltage, known as the snap-back trigger voltage, the voltage $V_{ce}$ snaps back to a lower value. The device clamps the voltage at this lower value, known as the snapback holding voltage. In this conduction mode, the transistor presents a very low impedance and, thus, conducts any current to ground.

The ESD protection device shown in FIG. 1, includes multiple channels through which the relatively high ESD currents may be conducted in order to reduce the voltage and current stress on the device. Each channel is defined by a metal connecting terminal 4, in the drain region 2 of the transistor 3 and a corresponding metal connecting terminal 8 in the source region 6 of the transistor. Connecting terminals 4 are connected to solid metal connections 1. Metal openings or slots 7 are sometimes required for various process reasons. Ideally, during an ESD condition, substantially equal "current paths" are established between each pair of connecting terminals creating multiple nonintersecting and nondiscriminating paths to discharge the ESD current.

Another trend in semiconductor processing is to apply silicide to the source and drain regions of MOS transistors in order to improve their performance. Silicided regions typically exhibit lower surface resistance than the doped silicon that forms the source and drain regions.

Applying silicide to the gate and source regions of an ESD protection device, however, may affect the performance of the device. Because the silicide may have a relatively rough edge next to the gate, this may lead to high local electrical fields and to degradation of the edges by high current densities (and corresponding increases in temperature). Because the silicide has a relatively low sheet resistance the entire device current can collapse into one small device region and cause immediate damage.

Figure 2:
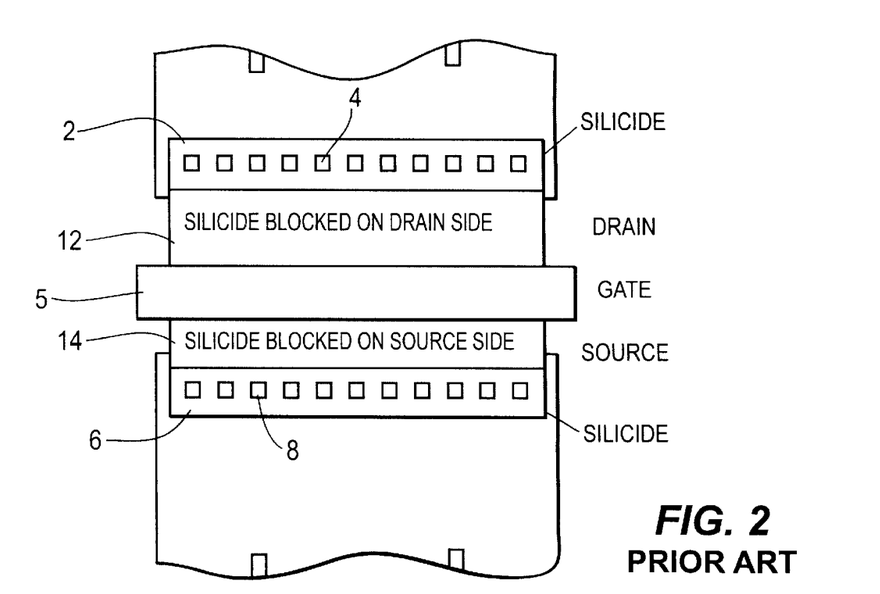
FIG. 2 (prior art) is a plan view of a silicided NMOS device implementing local blocking of the silicide.

Attempts have been made to increase the gate-to-contact spacing in ESD protection devices, placing the silicide farther away from the heat-generating collector-base junction area in attempts to minimize the possibility of silicide failure. One such device is shown in FIG. 2, described below. These methods, however, increase the device geometry and require special processing steps for the ESD protection devices to selectively prevent silicide from being applied to portions of the source and drain electrodes of the device.

Attempts also have been made to provide ESD protection, as described in U.S. Pat. No. 5,763,919, by implementing a MOS transistor array structure having dispersed parallel discharge paths. These dispersed parallel discharge paths are formed in the n-well regions and in the N+ drain regions of the structure. The dispersed N+ drain regions are defined by local oxidation or shallow trench isolation (STI). The part of the N+ to substrate junction close to the local oxidation or STI interface may exhibit mechanical stress causing, among other things, electric field focal points, current leakage and susceptibility to breakdown. This structure also has nonlinear discharge path resistance due to the N-well, and the performance of the structure is dependent upon the diffusion/well resistance. Another feature of this structure is that the dispersed parallel discharge paths are not isolated from the substrate, thus causing potential breakdown to the substrate (dispersed N+ drain regions) and adding undesirable additional parasitic capacitance (dispersed N+ regions and N-well regions).

SUMMARY OF THE INVENTION

The present invention is embodied in apparatus for current ballasting an ESD protection device. Ballasting resistance is achieved by coupling nonintersecting conductive strips between a common contact pad and a respective plurality of spaced connecting terminals of the ESD protection device. The connecting strips form respective ballasting resistors between the contact pad and the connecting terminals of the ESD device.

According to one aspect of the invention, the conductive strips are formed from metal.

According to another aspect of the invention, the conductive strips are formed from polysilicon.

According to yet another aspect of the invention, the conductive strips are formed from a vertically meandering connection of vias and connecting layers.

According to yet another aspect of the invention, the lateral resistance between the connecting terminals is enhanced by segmenting the drain region of the ESD device locally between each pair of terminals.

According to another aspect of the invention, the lateral resistance between the connecting terminals is enhanced by defining a further gate electrode, having a portion that is parallel to the gate electrode of the ESD device and further portions that extend between the conductive strips.

According to another aspect of the invention, the ESD device is implemented as multiple component parallel-connected ESD devices, each component ESD device having a drain region, a gate region and a source region and including a plurality of nonintersecting conductive strips forming a respective plurality of ballasting resistors between a common electrically conductive terminal and a respective plurality of spaced connecting terminals in the respective drain region of each ESD device.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Although the present invention is described in terms of an NMOS ESD protection device, which operates as a parasitic NPN transistor, it is contemplated that the invention may be used for other ESD devices (e.g., MOS or bipolar) such as PMOS protection devices that operate as parasitic PNP transistors, diodes (e.g., zener diodes, avalanche diodes), and silicon controlled rectifiers. In these alternative embodiments, a single ESD protection device has multiple parallel connections.

As set forth above, one method to reduce the magnitude of localized electric currents in a device is to add a ballasting resistor. FIG. 2 (prior art) is a plan view of a silicided NMOS device, which uses local blocking of the silicide to introduce current ballasting. The ESD protection device shown in FIG. 2, containing discrete connecting terminals 4 and 8 has silicide applied only in the contact regions 2 and 6. The remainder of the drain region 12 and source region 14 are not silicided. Current ballasting occurs due to the aspect ratio of the width of the structure to the length of the regions in which silicide is not applied (e.g., regions 12 and 14). One disadvantage of the configuration depicted in FIG. 2 is that the additional processing steps required to form devices in which silicide is applied to only a portion of the drain and/or source electrodes of selected MOS devices are costly and, in some cases, are known to reduce the yield and/or performance of the integrated circuit process.

The present invention overcomes the deficiencies in the prior art by creating separate electrically isolated ballasted current paths between the external contact and the contact electrodes of the ESD device, or the current carrying device being protected. These isolated ballasted current paths distribute current more evenly than the prior art devices, reducing current crowding which, in turn, reduces the localized heating of the ESD device. An exemplary embodiment of the invention largely confines ESD current to nonintersecting resistive channels that exhibit lateral resistance between the channels. The combination of the resistive channels and the lateral resistance between channels ensures that current flow is spread evenly among the channels, confining ESD current flow and greatly reducing current crowding.

Because the ballasted current paths of the current invention are electrically isolated from the semiconductor substrate, several advantages are provided over the prior art. These advantages include protection performance independent of diffusion/well resistance and no added mechanical stress caused by the material interface between the local oxidation and the silicon. Disadvantages of added mechanical stress include increased likelihood of (1) localization of electric fields, (2) leakage current and (3) breakdown. Also, the isolated ballasted current paths of the present invention provide other advantages over the prior art including ballast resistance linearity, lower values of ballast resistance, no added junction capacitance, more compact layout and no extra process steps (as with silicide-blocked devices).

Figure 3:
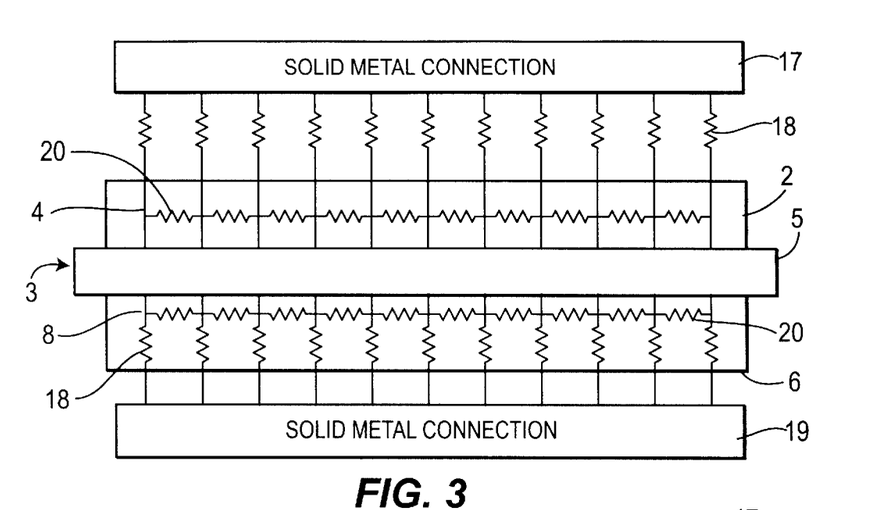
FIG. 3 is a schematic diagram, partly in plan diagram form, of an exemplary embodiment of the invention illustrating ballasting resistance and lateral resistance.

FIG. 3 is a schematic diagram, partly in plan diagram form, of an exemplary embodiment of the invention illustrating ballasting resistance and lateral resistance. In this embodiment, a metal contact 17 representing, for example, an external contact of the integrated circuit, is connected to the drain region 2 of the ESD protection device 3 through a plurality of nonintersecting resistive elements 18. As described below, each of the elements 18 provides a respective ballasting resistance. Between the resistive elements 18 on the drain region 2 of the ESD device 3 are a plurality of resistive elements 20. Each of these elements provide a lateral resistance that enhances the ballasting effect of the resistive elements 18. The lateral resistors are a product of the configuration of the drain 2 of the ESD device 3 and the electrical isolation provided therein. Because the drain region is relatively narrow, significant resistance exists between adjacent connecting terminals. This resistance is additive along the device such that the resistance between the right-most contact electrode and the left-most contact point is the sum of the intervening resistances. The source region 6 of the ESD device 3 also includes ballasting resistors 18 and lateral resistors 20.

Although the exemplary embodiment of the invention couples the ESD device to an external connector 17, it is contemplated that the ESD device may be coupled to protect other nodes in the circuit from over voltage conditions. For example, the ESD device may be coupled between the positive and negative operational power connections of the circuit. While FIG. 3 shows the ballasting resistors being coupled to both the source and drain regions of the ESD device, it is contemplated that they may be connected to either the source region only, or drain region only.

The even distribution of current among the nonintersecting resistive channels occurs because, if any one channel draws more current than the other channels, the voltage drop across the resistive channel 18 increases resulting in a higher voltage at the external contact 17. This higher voltage, in turn, induces greater current flow through the other nonintersecting channels, causing the higher current on the one channel to be redistributed among the other channels. This analysis assumes that the channels remain distinct through the device. The lateral resistance 20 ensures that the current flow is reduced between the connecting terminals on the ESD protection device because, during an ESD event, the conduction path through the ESD protection device has a lower resistance than the conduction path from one connecting terminal to the next. Ideally, the value of lateral resistance 20 should be as large as possible. The value of the lateral resistance may be increased by increasing the spacing between each of the contacts 4 and each of the contacts 8, realizing however, that the width efficiency of the device may decrease when the spacing is increased above some value. The inventors have determined that any value of resistance approximately greater than the "on" resistance of the ESD protection device is acceptable. Thus, the combination of the ballasting resistors 18 and the lateral resistors 20 act to evenly distribute ESD current among the multiple nonintersecting paths through the ESD device 3.

Figure 4A:
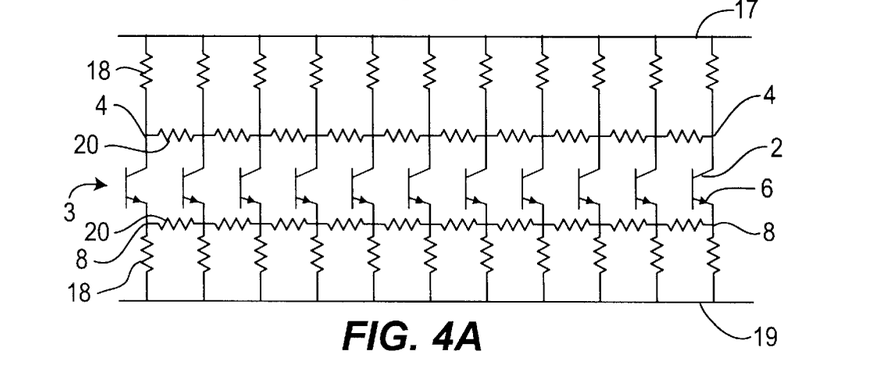
FIG. 4A is a schematic diagram of an exemplary embodiment of the invention illustrating application to a parasitic bipolar device.

FIG. 4A is schematic diagram of an exemplary embodiment of the invention illustrating the parasitic bipolar transistors that are formed by the "current paths" flowing between respective pairs of the connecting terminals 4 and 8 on the drain and source of the ESD device. As shown in FIG. 4A, the structure of the exemplary ESD device forms a plurality of open-base NPN transistors having collector electrodes connected to the drain connecting terminals 4 of the ESD device and emitter electrodes connected to the source connecting terminals 8 of the ESD device. Each of the plurality of parasitic NPN transistors enters a snap-back mode to conduct ESD current and currents resulting from other over voltage conditions when the voltage across the transistor exceeds the snap-back threshold potential. Although the parasitic NPN transistors are shown as open base devices, because the base electrodes are implemented in the semiconductor substrate, the devices are not necessarily open base. The substrate potential applied to the base electrodes, however, is relatively small and does not significantly affect the performance of the parasitic NPN transistor as an ESD protection device.

Figure 4B:
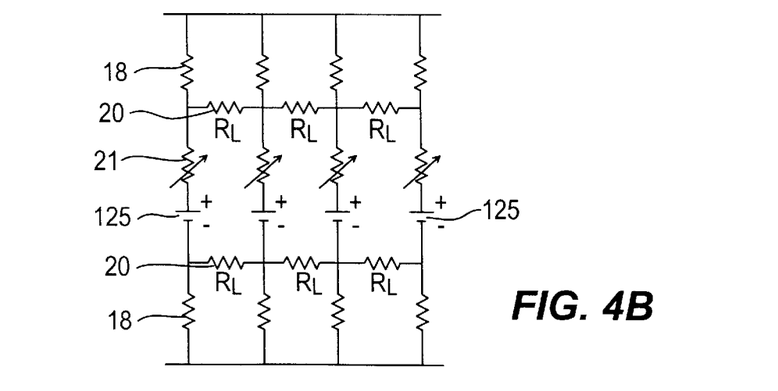
FIG. 4B is an equivalent schematic diagram of an the exemplary embodiment shown in FIG. 4A illustrating the variable resistance of the parasitic bipolar device and indicating the voltage clamping capability of the voltage sources.

FIG. 4B is an equivalent schematic diagram of the embodiment of the invention shown in FIG. 4A illustrating the variable resistance exhibited by the NPN transistors. In FIG. 4B, the NPN transistors shown in FIG. 4A are modeled as variable resistors 21 each with an offset voltage source 125 determined by the snapback holding voltage. The value of resistance for each variable resistor 21 is a function of the ESD current flowing through the respective conductive path. Ideally, as stated previously, the lateral resistance 20 should be as large as possible to ensure even distribution of the ESD current among the conduction paths. This condition is met by making lateral resistance 20 and the ballast resistance 18 large compared to the variable resistance 21.

Figure 5:
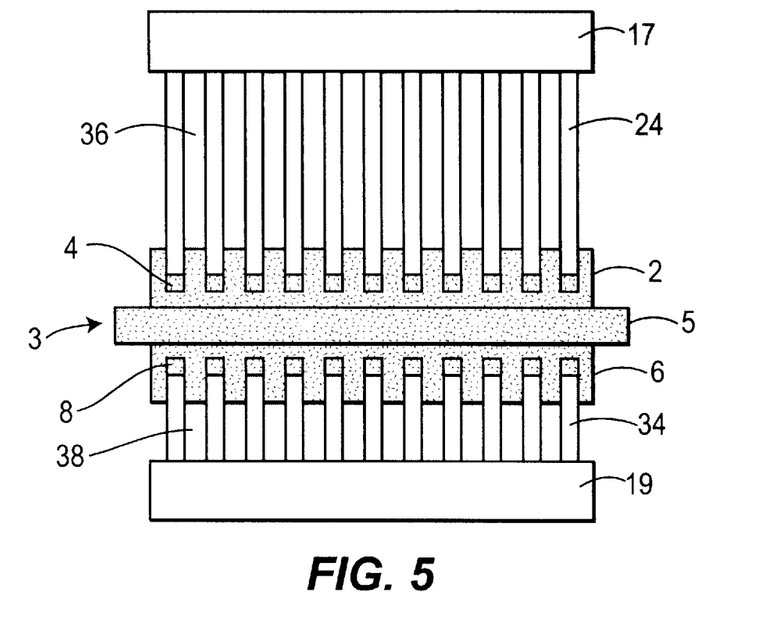
FIG. 5 is a plan view of an exemplary embodiment of the invention illustrating nonintersecting strips of metal.

FIG. 5 is a top plan view of a first exemplary embodiment of the invention which uses nonintersecting strips of metal 24 and 34 to form the ballast resistors. In FIG. 5, strips of metal 24 on the drain side of the device are coupled between a common terminal 17 and discrete connecting terminals 4 within a silicided drain region 2 of the ESD device 3. Strips of metal 34 on the source side of the device are coupled to respective discrete connecting terminals 8 within the silicided source region 6 to connect the source region 6 to a common terminal 19 which may, for example, be connected to a source of reference potential (e.g. ground). Strips of metal 24 are configured to be nonintersecting and are separated by spacings 36. Strips of metal 34 are also configured to be nonintersecting and are separated by spacings 38. Each strip of metal provides a path for ESD current flow and provides ballasting resistance. Lateral resistance is exhibited between adjacent metal strips by the coupling of each metal strip to discrete connecting points. In exemplary embodiments of the invention, the length and width of each metal strip, the spacing between strips, and the height of the drain region 2 are chosen to provide the desired amount of ballasting resistance. In another embodiment of the invention, current ballasting is provided only on one side of the device (i.e., either the drain side or the source side). The oxide coating aids in providing isolation between the metal strips 24 and 34 and the semiconductor substrate. The formation of the strips 24 and 34 does not require any special processing steps but may be done as a part of the normal metallization procedures.

Figure 6:
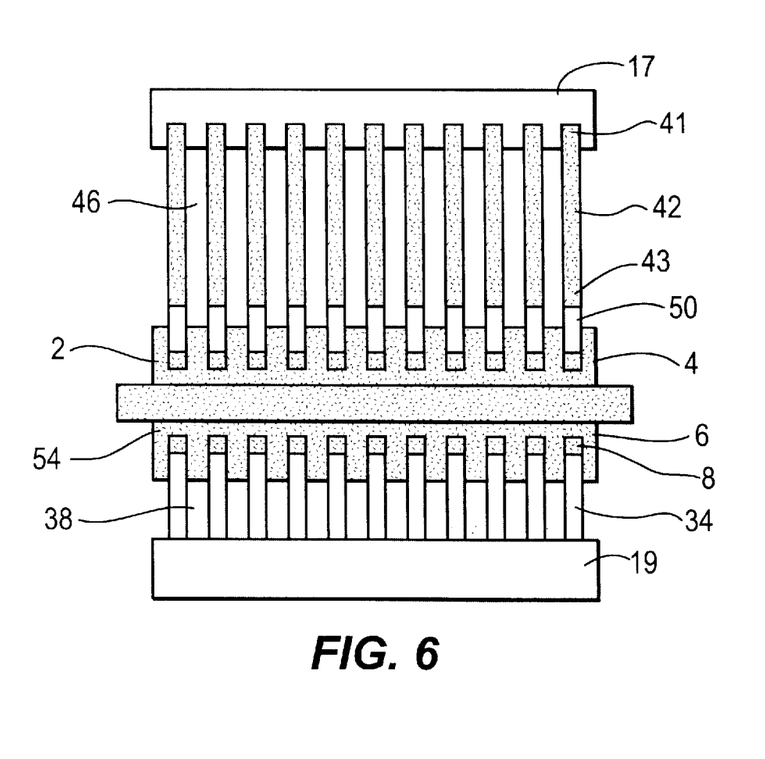
FIG. 6 is a plan view of an exemplary embodiment of the invention illustrating nonintersecting strips of polysilicon.

FIG. 6 is a top plan view of a second exemplary embodiment of the invention illustrating the use of nonintersecting strips of polysilicon to form the ballasting resistors. In this embodiment, the polysilicon strips 42 are connected to the common terminal 17 via connectors 41 and are connected to short metal strips 50 via connectors 43. The short metal strips 50, in turn, are connected to the drain region 2 of the ESD device 3 by the connecting terminals 4. In the exemplary embodiment of the invention, the metal regions 50 are used to connect the polysilicon strips to the ESD device because the current state of the art processing rules do not permit connecting polysilicon directly to the silicided diffusion 2. Strips 42 are configured to be nonintersecting and are separated by spacings 46. In this exemplary embodiment of the invention, metal strips 34, on the source side of the ESD device 3, are coupled to silicided source region 6 at discrete connecting terminals 8. In the exemplary embodiment, these strips connect the source region 6 to ground via the common terminal 19.

As in the embodiment shown in FIG. 5, the strips 34 are configured to be nonintersecting and are separated by spacings 38. An advantage of using polysilicon strips 42 over metal strips 24, shown in FIG. 5, is that the sheet resistance of the polysilicon strip is approximately an order of magnitude greater than the sheet resistance of metal. Because of this higher resistance, the use of silicided polysilicon strips allows for a more compact structure than when metal strips are used. The structure shown in FIG. 6 may be formed without any additional process steps. The polysilicon strips 42 may be deposited when other polysilicon layers are processed, thus an underlying oxide layer provides isolation between strips 34 and 42. The metal strips 50 and 34 may be part of the normal metallization process and the connectors 41, 43, and the connecting terminals 4 and 8 may be, for example, tungsten vias that are also a part of the normal semiconductor process.

Figures 7A, 7B:
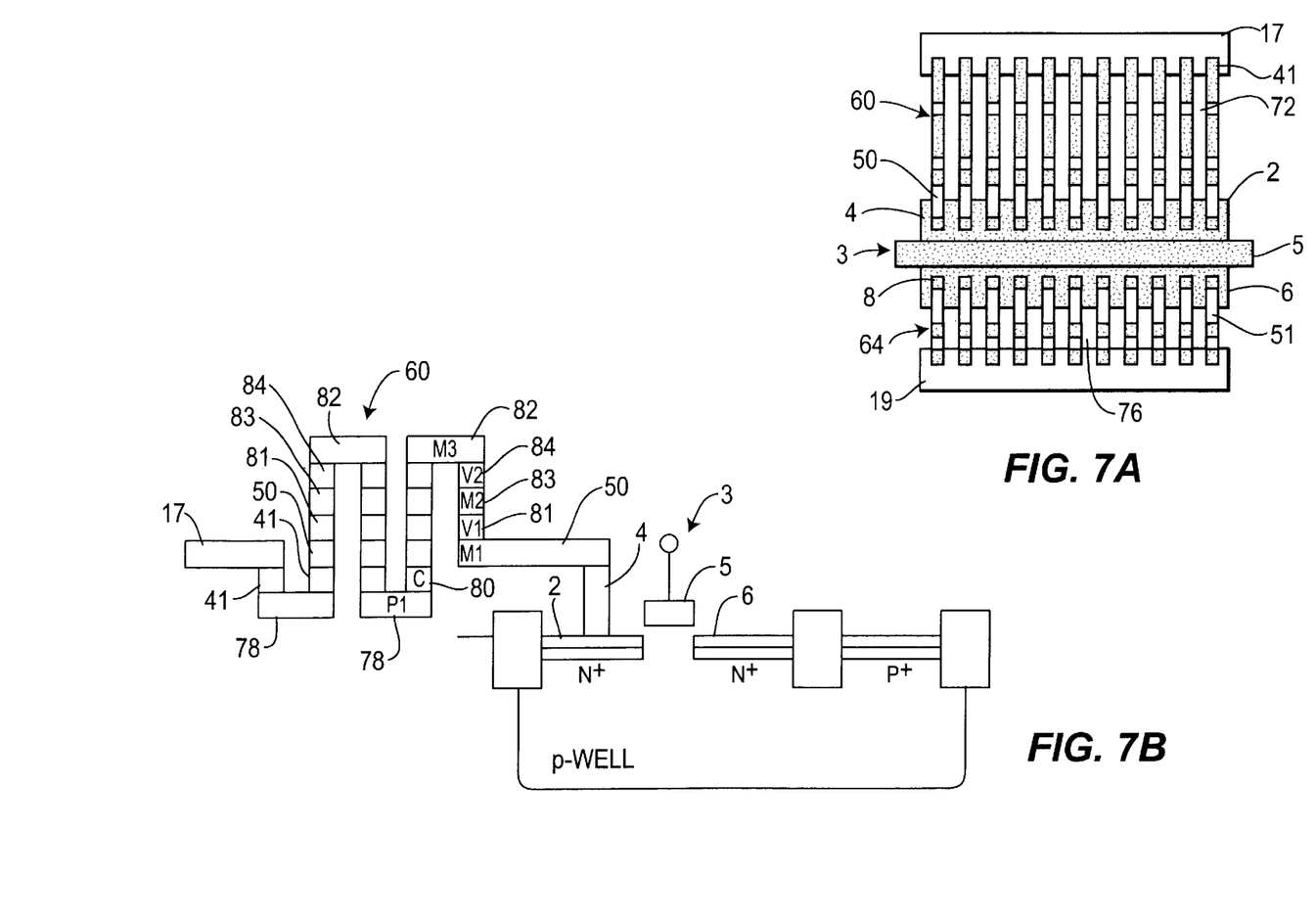
FIG. 7A is a plan view of an exemplary embodiment of the invention illustrating vertically meandering nonintersecting strips.
FIG. 7B is a cross sectional view of a single vertically meandering strip. For illustrative purposes, one of the vertically meandering nonintersecting strips 60 is shown in FIG. 7B.

FIG. 7A is a top plan view of a third exemplary embodiment of the invention illustrating vertically meandering nonintersecting strips. In this embodiment, each strip 60 and 64, is formed by joining, for example, polysilicon and metal strips formed at different levels in the integrated circuit process with contact vias that are also a part of the process. The ballasting resistors 60 and 64 are formed by the series connection of polysilicon, vias, and metal. Ballasting resistors 60 and 64 are isolated by the same mechanism that isolates the components of each ballasting resistor. Vertically meandering nonintersecting strips 60, on the drain side of the device, are coupled to the silicided drain region 2 by the connecting terminals 4. The vertically meandering nonintersecting strips 60 are separated by spacings 72. Vertically meandering nonintersecting strips 64, on the source side of the device, are coupled to silicided source region 6 at the connecting terminals 8. The strips 64 are configured to be nonintersecting and are separated by spacings 76.

FIG. 7B is a cross sectional view of a single vertically meandering strip 60 according to the third embodiment of the invention. This meandering strip connects the common terminal 17 to the drain region 2 of the ESD device 3. Starting at the external connector 17, the strip 60 comprises a connector 41 down to a segment of polysilicon 78, up to another connector 41, to a metal layer 50, to a via 81, to a segment of a second metal layer 83, to a second via 84 and to a segment of a third metal layer 82. The segment of the third metal layer 82 is connected to another segment of the polysilicon layer 78 through a series connection of a via, a segment of the second metal layer, another via, a segment of the first metal layer and a connector. This second segment of polysilicon is connected to a second segment of the third metal layer 82 through a connector, a segment of the first metal layer, a via, a segment of the second metal layer and another via. Finally, in this exemplary embodiment, the second segment of the third metal layer 82 is connected to the drain region 2 of the ESD device 3 through a series connection of a via 84, a segment of the second metal layer 83, another via 81, a segment of the first metal layer 50 and a connecting terminal 4. In the exemplary embodiment of the invention, the first, second and third metal layers may be aluminum or copper films and the vias and connecting terminals may be tungsten plugs. These series connections form the ballasting resistor 60. In this embodiment, each of the vias adds a significant resistance (e.g. 5 to 10 ohms in advanced deep sub-micron technologies) to the ballasting resistor 60. Each of the other layers also adds resistance, typically the resistance of the metal layers is negligible compared to the combined resistance of the polysilicon layers 78, the connectors 41, and the vias 81 and 84. An advantage of the exemplary embodiment of the invention depicted in FIGS. 7A and 7B is the compactness of the configuration.

The number of layers and the number of meanders is exemplary only. It is contemplated that a satisfactory ballasting resistor may be fabricated using more or fewer layers and/or more or fewer meanders.

Figure 8:
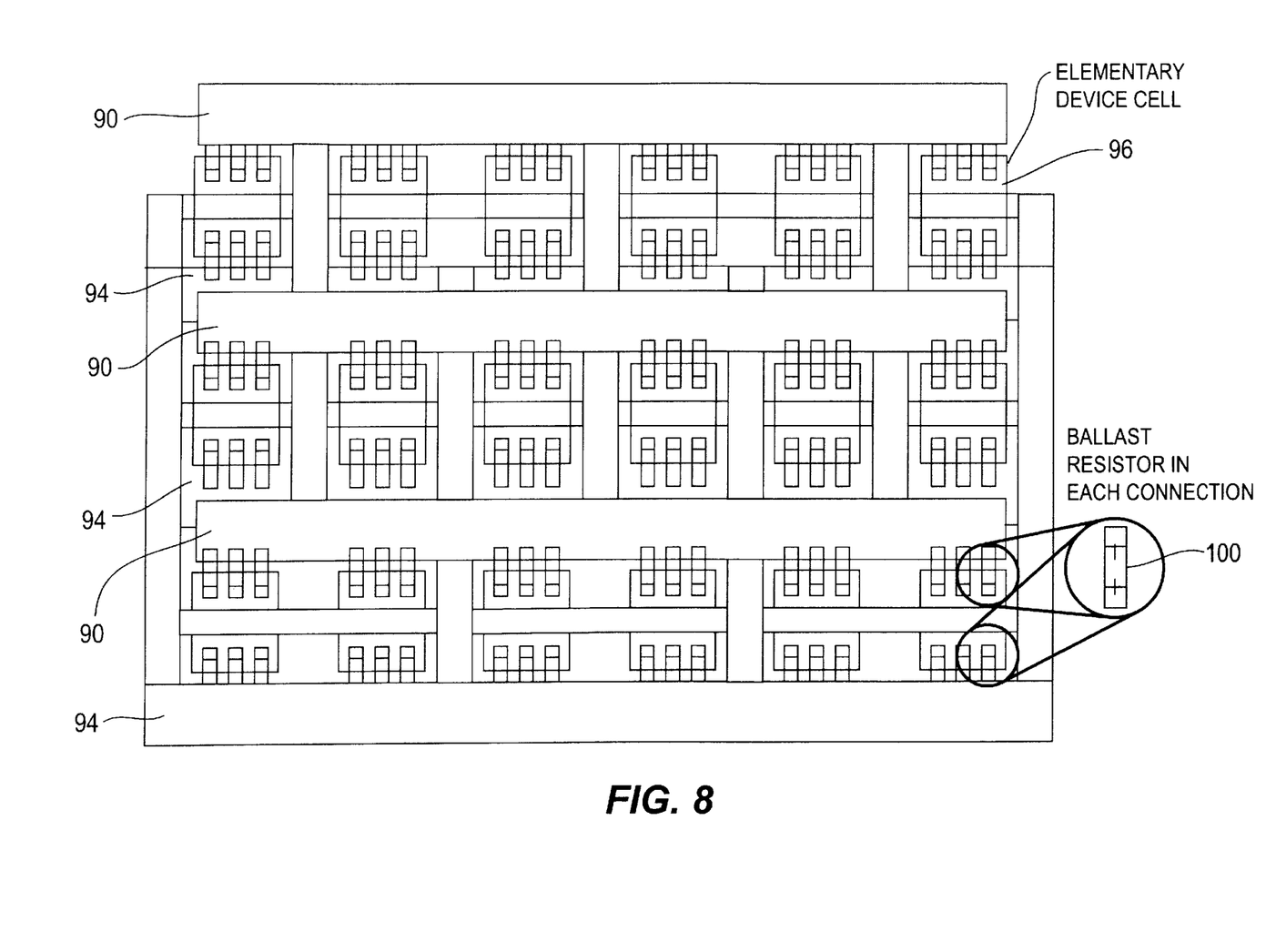
FIG. 8 is a plan view of an exemplary embodiment of the invention illustrating an array of individually ballasted protection device cells.

FIG. 8 is a top plan view of a fourth exemplary embodiment of the invention illustrating an array of individually ballasted protection device cells. Each elementary protection device cell 96 is coupled to a first terminal 90 and a second terminal 94 by respective non-intersecting strips 100. The nonintersecting strips 100 provide ballasting resistance. Nonintersecting strips 100 may comprise any of the embodiments previously described or described below, using metal, polysilicon, vertical meandering strips, or any combination thereof to form the ballast resistors 100. Advantages of the exemplary embodiment depicted in FIG. 8 are that it may be implemented in a relatively small area and that it evenly distributes the ESD current over a large number of ESD devices and, thus, can handle relatively large ESD events.

Figure 9:
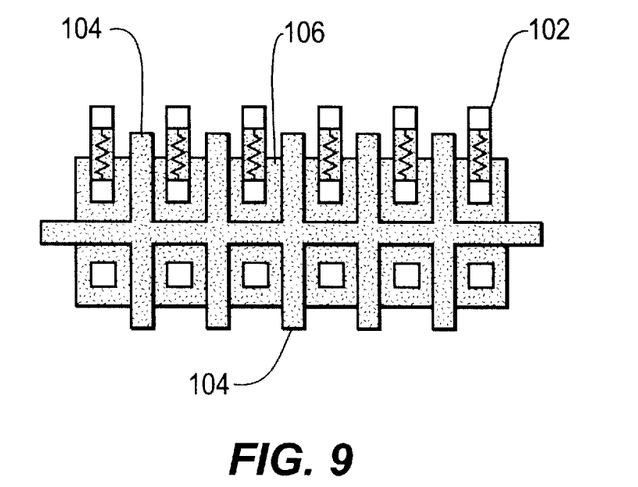
FIG. 9 is a plan view of an embodiment of the invention illustrating an array of ballasted protection device cells providing improved triggering utilizing segmented drain and source regions.

FIG. 9 is a plan view of a fifth embodiment of the invention, an ESD protection device providing additional lateral isolation and improved triggering by utilizing a segmented drain and source regions. In FIG. 9, there are a plurality of nonintersecting strips 102 positioned in the drain region but not in the source region. The device shown in FIG. 9 includes active areas 106 separated by polysilicon conductive elements 104, and underlying dielectric and well or substrate material. Conductive elements 104 are not required to be connected to the gate electrode, thus, in alternate embodiments of the inventions, conductive elements are or are not connected to the gate electrode. Nonintersecting strips 102 provide ballast resistance. Nonintersecting strips 102 may comprise any of the embodiments previously described, including metal, silicided polysilicon, vertical meandering strips, or any combination thereof. The device shown in FIG. 9 utilizes area efficiently by compactly forming separate protection device cells in the ESD device. Polysilicon elements 104 impede lateral current in the source and drain regions thus providing isolation between nonintersecting strips 102. Close proximity of the protection device cells provides improved triggering of the ESD device. In the embodiment of the invention shown in FIG. 9 utilizing MOS technology, triggering is enhanced by the increased drain-junction perimeter (i.e. by increasing the dV/dt (transient) triggering of the parasitic npn transistors). Further triggering improvement is obtained in the embodiment shown in FIG. 9, as the increased drain-gate overlap capacitance allows the gate electrode to be coupled to ground through a high ohmic resistance. It is contemplated that the segmented drain regions may be further separated by extensions of the channel region beneath the extended gate regions.

Figure 10:
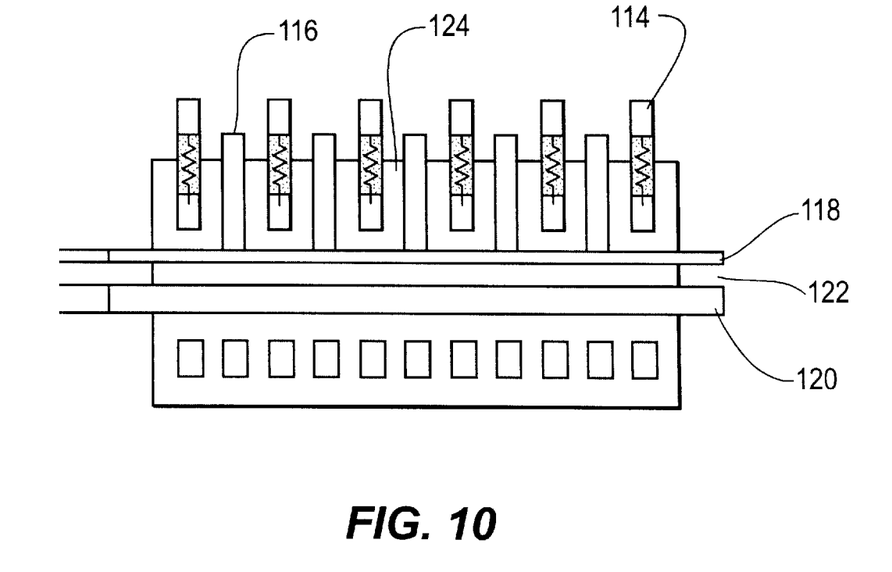
FIG. 10 is a plan view of an embodiment of the invention illustrating an array of ballasted protection device cells providing improved triggering utilizing a segmented drain region and configured to reduce local high current densities.

FIG. 10 is a plan view of an sixth embodiment of the invention illustrating an ESD device configured to further reduce local high electric field densities. The array depicted in FIG. 10 comprises active areas 124 separated by polysilicon conductive elements 116. Nonintersecting strips 114 provide ballast resistance. Nonintersecting strips 114 may comprise any of the embodiments previously described, including metal, polysilicon, vertical meandering strips, or any combination thereof. Polysilicon elements 116 impede lateral current flow thus providing isolation between nonintersecting strips 114. The corners formed at the intersection of the vertical and horizontal segments of polysilicon elements 112, however, may cause relatively high local electric field densities. The split gate configuration shown in FIG. 10 reduces local electric field densities. In this alternate configuration, a main polysilicon strip (gate) 120 is formed to be of nominal transistor gate length. Polysilicon elements 116 are coupled by narrow polysilicon strip 118 which is desirably formed entirely within the drain region and having a gate length that is desirably less than the minimum design rules for the integrated circuit process. The space 122, between polysilicon strips 118 and 120 is also formed to be as narrow as possible. The active area 124, the polysilicon strip 118, and the active area (N+) region located in the space 122, from a further MOS/bipolar transistor. This transistor, which is in series with the MOS transistor of the ESD device, is intentionally formed to be leaky because of its short gate length. Thus, this further transistor acts as a resistor that diverts the ESD current from the drain contacts to the edge of the gate in the main transistor. The lateral current flow is still impeded by polysilicon elements 116 as described above, to prevent current crowding in the device.

While the present invention has been described in terms of multiple exemplary embodiments, it is contemplated that may be practiced as described above, within the scope of the appended claims.

What is claimed is:

1. Apparatus for current ballasting an electrostatic discharge (ESD) sensitive device having a first region and a second region, for protecting a node in an electronic circuit from over voltage conditions by providing a conductive path through the first and second regions to a terminal configured to be coupled to a source of reference potential when said ESD device is turned on, said apparatus comprising:

a plurality of spaced connecting terminals in the first region of the ESD sensitive device for providing respective electrical contacts to the first region, the first region and the spaced connecting terminals being configured to exhibit a lateral resistance in the first region between successive ones of the spaced connecting terminals, wherein the lateral resistance is greater than a resistance of the conductive path when the ESD device is turned on; and a plurality of isolated nonintersecting conductive strips, each having a first end and a second end, the first end of each of the isolated nonintersecting conductive strips being electrically coupled to the node and the second end of each of the isolated nonintersecting conductive strips being coupled to a respectively different one of the plurality of spaced connecting terminals.

2. Apparatus according to claim 1 further comprising:

a plurality of further spaced connecting terminals in the second region of the ESD sensitive device for providing respective electrical contacts to the second region, the second region and the spaced connecting terminals being configured to exhibit a lateral resistance between successive ones of the further spaced connecting terminals; and a plurality of further nonintersecting conductive strips, each having a first end and a second end, the first end of each of the further nonintersecting conductive strips being electrically coupled to a respectively different one of the further spaced connecting terminals and the second end of each of the further nonintersecting conductive strips being coupled to the terminal which is configured to be coupled to the source of reference potential.

3. Apparatus according to claim 2 wherein the ESD sensitive device comprises an NMOS ESD device that forms a parasitic bipolar transistor, the first region being a drain region, the second region being a source region, and a third region being a gate region, said apparatus comprising a plurality of conductive elements, each conductive element being electrically coupled to the third region of the ESD device and extending into the first region between a respective pair of adjacent ones of the plurality of spaced connecting terminals and into the second region of the ESD device between a respective pair of adjacent ones of the plurality of further spaced connecting terminals.

4. Apparatus according to claim 1 wherein at least one of the plurality of isolated nonintersecting conductive strips is made of metal.

5. Apparatus according to claim 1 wherein at least one of the plurality of isolated nonintersecting conductive strips is segmented and includes at least one segment made of polysilicon.

6. Apparatus according to claim 5 wherein the at least one segmented nonintersecting conductive strip includes a plurality of series connected resistive elements selected from a group consisting of contacts, vias, polysilicon films and metal films.

7. Apparatus according to claim 1, wherein each of the isolated nonintersecting conductive strips exhibits a resistance and the first region and the plurality of spaced connecting terminals are configured such that the lateral resistance between successive ones of the spaced conducting terminals in the first region of the ESD device is relatively large compared to the resistance exhibited by the at least one nonintersecting conductive strip.

8. Apparatus according to claim 7 further including a plurality of conductive elements, insulated from and entirely above the first region of the ESD device, each element having a first end and a second end, the first ends of the elements being electrically connected above the first region of the ESD device and the second ends, extending across the first region of the ESD device between respective pairs of the spaced connecting terminals.

9. Apparatus according to claim 1 wherein the ESD sensitive device is selected from the group consisting of an NMOS transistor, a zener diode, an avalanche diode, a silicon controlled rectifier, a PMOS transistor, an NPN transistor, and a PNP transistor.

10. An electrostatic discharge (ESD) protection device for protecting a node in an electronic circuit from over voltage conditions by providing a conductive path through the ESD device to a terminal configured to be coupled to a source of reference potential when said ESD device is turned on, the ESD device comprising:

a drain region of a first semiconductor type, the drain region including a plurality of spaced connecting terminals which provide respective electrical contacts to the drain region, wherein the drain region and the spaced connecting terminals are configured to exhibit a lateral resistance between successive ones of the spaced connecting terminals, which lateral resistance is greater than a resistance of the conductive path through the ESD device when the ESD device is turned on;

a channel region of a second semiconductor type, having a length and a width, the channel region being in physical contact with the drain region along the width of the channel region;

a source region of the first semiconductor type, the source region being in physical contact with the channel region along the width of the channel region and separated from the drain region by the length of the channel region, the source region being connected to the terminal which is configured to be connected to a source of reference potential;

a gate electrode, insulated from and positioned above the channel region;

a plurality of isolated nonintersecting conductive strips, each having a first end and a second end, the first end of each of the isolated nonintersecting conductive strips being electrically coupled to the node and the second end of each of the nonintersecting conductive strips being coupled to a respectively different one of the plurality of spaced connecting terminals.

11. An ESD device according to claim 10, further comprising:

a plurality of further spaced connecting terminals in the source region of the ESD protection device for providing respective electrical contacts to the source region, the source region and the spaced connecting terminals being configured to exhibit a lateral resistance between successive ones of the further spaced connecting terminals; and a plurality of further nonintersecting conductive strips, each having a first end and a second end, the first end of each of the further nonintersecting conductive strips being electrically coupled to a respectively different one of the further spaced connecting terminals and the second end of each of the further nonintersecting conductive strips being coupled to the terminal which is configured to be connected to the source of reference potential.

12. An ESD device according to claim 10 wherein the plurality of isolated nonintersecting conductive strips are made from metal.

13. An ESD device according to claim 10 wherein the plurality of isolated nonintersecting conductive strips are segmented and each strip includes at least one segment made of polysilicon.

14. An ESD device according to claim 10, wherein the plurality of segmented nonintersecting conductive strip includes a plurality of series connected vertically meandering resistive elements selected from a group consisting of contacts, vias, polysilicon films and metal films.

15. An ESD device according to claim 10, wherein:

the drain region is segmented into a plurality of drain regions, each segmented drain region including a respectively different one of the spaced connecting terminals, the segmented drain regions being separated by respective channels of a semiconductor of the second type; and the source region is segmented into a plurality of source regions, each segmented source region including a respectively different one of the further spaced connecting terminals, the segmented source regions being separated by respective channels of a semiconductor of the second type.

16. An ESD device according to claim 10, further comprising a further gate electrode, including:

a plurality of conductive elements, the conductive elements being insulated from and positioned above respective areas of the drain region that are between adjacent ones of the spaced connecting terminals; and a connecting element, for interconnecting the plurality of conductive elements, the connecting element being insulated from and positioned above the drain region in an area of the drain region adjacent to the gate electrode but separate from the gate electrode.

17. A composite electrostatic discharge (ESD) protection device for protecting a node in an electronic circuit from over voltage conditions by providing a conductive path through the ESD device to a reference terminal configured to be coupled to a source of reference potential when said ESD device is turned on, the ESD device comprising:

a plurality of component ESD devices, each component ESD device including:

a drain region of a first semiconductor type, the drain region including a plurality of spaced connecting terminals which provide respective electrical contacts to the drain region, wherein the drain region and the spaced connecting terminals are configured to exhibit a lateral resistance between successive ones of the spaced connecting terminals, the lateral resistance being greater than a resistance exhibited by the conductive path when the composite ESD device is turned on;

a channel region of a second semiconductor type, having a length and a width, the channel region being in physical contact with the drain region along the width of the channel region;

a source region of the first semiconductor type, the source region being in physical contact with the channel region along the width of the channel region and separated from the drain region by the length of the channel region, the source region including a plurality of further spaced connecting terminals which provide respective electrical contacts to the source region, wherein the source region and the further spaced connecting terminals are configured to exhibit a lateral resistance between successive ones of the further spaced connecting terminals;

a gate electrode, insulated from and positioned above the channel region;

first and second common electrically conductive terminals;

a plurality of first nonintersecting conductive strips, each having a first end and a second end, the first end of each of the first nonintersecting conductive strips being electrically coupled to the first common electrically conductive terminal and the second end of each of the first nonintersecting conductive strips being coupled to a respectively different one of the plurality of spaced connecting terminals for making electrical contact with the drain region;

a plurality of second nonintersecting conductive strips, each having a first end and a second end, the first end of each of the second nonintersecting conductive strips being electrically coupled to the second common electrically conductive terminal and the second end of each of the second nonintersecting conductive strips being coupled to a respectively different one of the plurality of further spaced connecting terminals for making contact with the source region; and a first conductor connecting the first common electrically conductive terminals of all of the component ESD devices;

a second conductor connecting the second common electrically conductive terminals of all of the component ESD devices to the reference terminal.

18. An electrostatic discharge (ESD) protection device comprising:

a plurality of component ESD devices, each component ESD device including:

a first region of a first semiconductor type, the first region including a plurality of spaced connecting terminals which provide respective electrical contacts to the first region, wherein the first region and the spaced connecting terminals are configured to exhibit a lateral resistance between successive ones of the spaced connecting terminals;

a second region of a second semiconductor type, the second region including a plurality of further spaced connecting terminals which provide respective electrical contacts to the second region, wherein the second region and the further spaced connecting terminals are configured to exhibit a lateral resistance between successive ones of the further spaced connecting terminals;

first and second common electrically conductive terminals;

a plurality of first nonintersecting conductive strips, each having a first end and a second end, the first end of each of the first nonintersecting conductive strips being electrically coupled to the first common electrically conductive terminal and the second end of each of the first nonintersecting conductive strips being coupled to a respectively different one of the plurality of spaced connecting terminals for making electrical contact with the first region;

a plurality of second nonintersecting conductive strips, each having a first end and a second end, the first end of each of the second nonintersecting conductive strips being electrically coupled to the second common electrically conductive terminal and the second end of each of the second nonintersecting conductive strips being coupled to a respectively different one of the plurality of further spaced connecting terminals for making contact with the second region; and a first conductor connecting the first common electrically conductive terminals of all of the component ESD devices;

a second conductor connecting the second common electrically conductive terminals of all of the component ESD devices.

* * * * *